(12) United States Patent
Lin et al.

(10) Patent No.: US 10,573,593 B2
(45) Date of Patent: *Feb. 25, 2020

(54) METAL INTERCONNECTS FOR SUPER (SKIP) VIA INTEGRATION

(71) Applicant: GLOBALFOUNDRIES INC., Grand Cayman (KY)

(72) Inventors: Sean Xuan Lin, Watervliet, NY (US); Xunyuan Zhang, Albany, NY (US); Shao Beng Law, Watervliet, NY (US); James Jay McMahon, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 15/983,168

(22) Filed: May 18, 2018

(65) Prior Publication Data

US 2018/0269150 A1    Sep. 20, 2018

Related U.S. Application Data

(62) Division of application No. 15/437,100, filed on Feb. 20, 2017, now Pat. No. 10,026,687.

(51) Int. Cl.
*H01L 21/4763* (2006.01)
*H01L 23/522* (2006.01)
(Continued)

(52) U.S. Cl.
CPC .... *H01L 23/5226* (2013.01); *H01L 21/76879* (2013.01); *H01L 23/53209* (2013.01);
(Continued)

(58) Field of Classification Search
CPC ........... H01L 21/76843; H01L 23/5226; H01L 23/53295; H01L 21/76877; H01L 21/76879; H01L 21/76802
(Continued)

(56) References Cited

U.S. PATENT DOCUMENTS 6,392,898 B1    5/2002    Asai et al.
6,531,661 B2    3/2003    Uchikawa et al.
(Continued)

FOREIGN PATENT DOCUMENTS

KR    20110096275    8/2011
TW    201707144    2/2017

OTHER PUBLICATIONS

Taiwanese Office Action and Search Report in related TW Application No. 106112179 dated Sep. 26, 2018, 11 pages.

*Primary Examiner* — S. V. Clark
(74) *Attorney, Agent, or Firm* — Anthony Canale; Andrew M. Calderon; Roberts Mlotkowski Safran Cole & Calderon, P.C.

(57) ABSTRACT

The present disclosure relates to semiconductor structures and, more particularly, to metal interconnect structures for super (skip) via integration and methods of manufacture. The structure includes: a first wiring layer with one or more wiring structures; a second wiring layer including an interconnect and wiring structure; and at least one upper wiring layer with one or more via interconnect and wiring structures located above the second wiring layer. The one or more via interconnect and wiring structures partially including a first metal material and remaining portions with a conductive material over the first metal material. A skip via passes through the second wiring layer and extends to the one or more wiring structures of the first wiring layer. The skip via partially includes the metal material and remaining portions of the skip via includes the conductive material over the first metal material.

12 Claims, 2 Drawing Sheets

(51) Int. Cl.
*H01L 23/532* (2006.01)
*H01L 21/768* (2006.01)

(52) U.S. Cl.
CPC .. *H01L 23/53295* (2013.01); *H01L 21/76816* (2013.01); *H01L 23/53223* (2013.01); *H01L 23/53238* (2013.01); *H01L 23/53252* (2013.01)

(58) Field of Classification Search
USPC .................................................. 438/622, 637
See application file for complete search history.

(56) References Cited

U.S. PATENT DOCUMENTS

| | | | |
|---|---|---|---|
| 9,148,963 B2 * | 9/2015 | Matsuda | H05K 3/4685 |
| 9,805,972 B1 * | 10/2017 | Zhang | H01L 21/76816 |
| 2002/0108776 A1 * | 8/2002 | Uchikawa | H05K 3/4602 |
| | | | 174/255 |
| 2002/0182890 A1 | 12/2002 | Ishida et al. | |
| 2006/0289202 A1 | 12/2006 | Takeuchi et al. | |
| 2009/0119706 A1 | 5/2009 | Hope et al. | |
| 2009/0236143 A1 | 9/2009 | Nakamura | |
| 2013/0020468 A1 | 1/2013 | Mitsuhashi et al. | |
| 2013/0089658 A1 | 4/2013 | Matsuda et al. | |
| 2013/0264688 A1 | 10/2013 | Qian et al. | |
| 2014/0264709 A1 | 9/2014 | Tsai et al. | |
| 2014/0353839 A1 | 12/2014 | Lin et al. | |
| 2015/0270176 A1 | 9/2015 | Xie et al. | |
| 2017/0103944 A1 * | 4/2017 | Fukui | H05K 3/4038 |
| 2017/0164458 A1 | 6/2017 | Vrtis et al. | |

\* cited by examiner

METAL INTERCONNECTS FOR SUPER (SKIP) VIA INTEGRATION

FIELD OF THE INVENTION

The present disclosure relates to semiconductor structures and, more particularly, to metal interconnect structures for super (skip) via integration and methods of manufacture.

BACKGROUND

A via is an electrical connection between wiring structures (e.g., wiring layers) in a physical electronic circuit that goes through the plane of one or more adjacent layers. For example, in integrated circuit design, a via is a small opening in an insulating oxide layer that allows a conductive connection between different wiring layers. A via connecting the lowest layer of metal to diffusion or poly is typically called a "contact".

In via technology, a super via, also known as a skip via, can be formed through many insulator layers, e.g., bypassing one or more wiring structures within the insulator layers, to connect with a lower wiring structure. This provides improved resistance characteristics, minimizes capacitance for a lower wiring structure, e.g., at M0 layer, as well as provides area efficiencies in the chip manufacturing process.

There are many challenges to using skip vias, though. For example, in the manufacturing process, the skip via will need to land on a wiring structure in a lower level (e.g., M0 level), while the regular via will need to land on the wiring structure in an upper level (e.g., M1 or above level). Also, in skip via processes, a conventional copper plating process is used to fill the vias. The copper plating process, though, grows from all directions including the sidewalls and bottom of the via resulting in extensive voids created due to pinch-off from sidewall growth and bottom voids from insufficient physical vapor deposition (PVD) seed coverage on the high aspect ratio via. Voids can also result from the undercut profile formed by ultra-low k (ULK) plasma-induced-damage (PID) or cap-to-interlevel dielectric selectivity. Also, the liner/seed is not sufficient to cover the full length of the high aspect ratio via, also resulting in void formation. These voids negatively affect the resistivity of the skip vias which, in turn, decreases device performance.

SUMMARY

In an aspect of the disclosure, a structure comprises: a first wiring layer with one or more wiring structures; a second wiring layer comprising an interconnect structure and a wiring structure; at least one upper wiring layer with one or more via interconnect and wiring structures located above the second wiring layer, the one or more via interconnect and wiring structures of the at least upper wiring layer partially comprising a first metal material with remaining portions comprising a conductive material over the first metal material; and a skip via passing through the second wiring layer and extending to the one or more wiring structures of the first wiring layer, the skip via partially comprising the metal material with remaining portions of the skip via comprising the conductive material over the first metal material.

In an aspect of the disclosure, a method comprises: forming a via to expose one or more wiring structures of an upper wiring layer; forming a skip via which passes through the upper wiring layer and which exposes one or more wiring structures of a lower wiring layer; selectively growing metal material in the via and partially within the skip via; and filling remaining portions of the skip via with conductive material.

In an aspect of the disclosure, a method comprises: forming a wiring layer with one or more wiring structures in a lower wiring layer; forming a wiring layer with one or more wiring structures in an upper wiring layer, located above the lower wiring layer; forming a via to expose the one or more wiring structures of the upper wiring layer; forming a skip via which passes through the upper wiring layer and which exposes the one or more wiring structures in the lower wiring layer; selectively growing metal material on exposed portions of the one or more wiring structures of the upper wiring layer and the lower wiring layer; and filling remaining portions of the skip via and a trench of another wiring layer above the upper wiring layer with conductive material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to metal interconnect structures for super (skip) via integration and methods of manufacture. More specifically, the present disclosure describes a selective electroless cobalt (Co) or Nickel (Ni) (or its alloys) process that grows material, e.g., cobalt or nickel, from the bottom-up in a skip via structure. Accordingly, by using the selective electroless growth process, cobalt or nickel will not form on the sidewalls of the skip via which, in turn, ensures that there is a void free fill regardless of profile and aspect ratio of the skip via. In this way, advantageously, extensive voids due to pinch-off from sidewall growth and bottom voids from insufficient physical vapor deposition (PVD) seed coverage on the high aspect ratio via can be prevented which, in turn, will decrease the resistivity of the skip vias and hence increase device performance. Also, advantageously, the metal interconnect structures described herein can have an impact on backend-of-the line (BEOL) and middle-of-the-line (MOL) interconnect structures for 7 nm devices and beyond, where conventional BEOL or MOL metallization may not be extendable.

The metal interconnect structures of the present disclosure can be manufactured in a number of ways using a number of different tools. In general, though, the methodologies and tools are used to form structures with dimensions in the micrometer and nanometer scale. The methodologies, i.e., technologies, employed to manufacture the metal interconnect structures of the present disclosure have been adopted from integrated circuit (IC) technology. For example, the structures are built on wafers and are realized in films of material patterned by photolithographic processes on the top of a wafer. In particular, the fabrication of the metal interconnect structures uses three basic building blocks: (i) deposition of thin films of material on a substrate, (ii) applying a patterned mask on top of the films by photolithographic imaging, and (iii) etching the films selectively to the mask.

Figure 1:
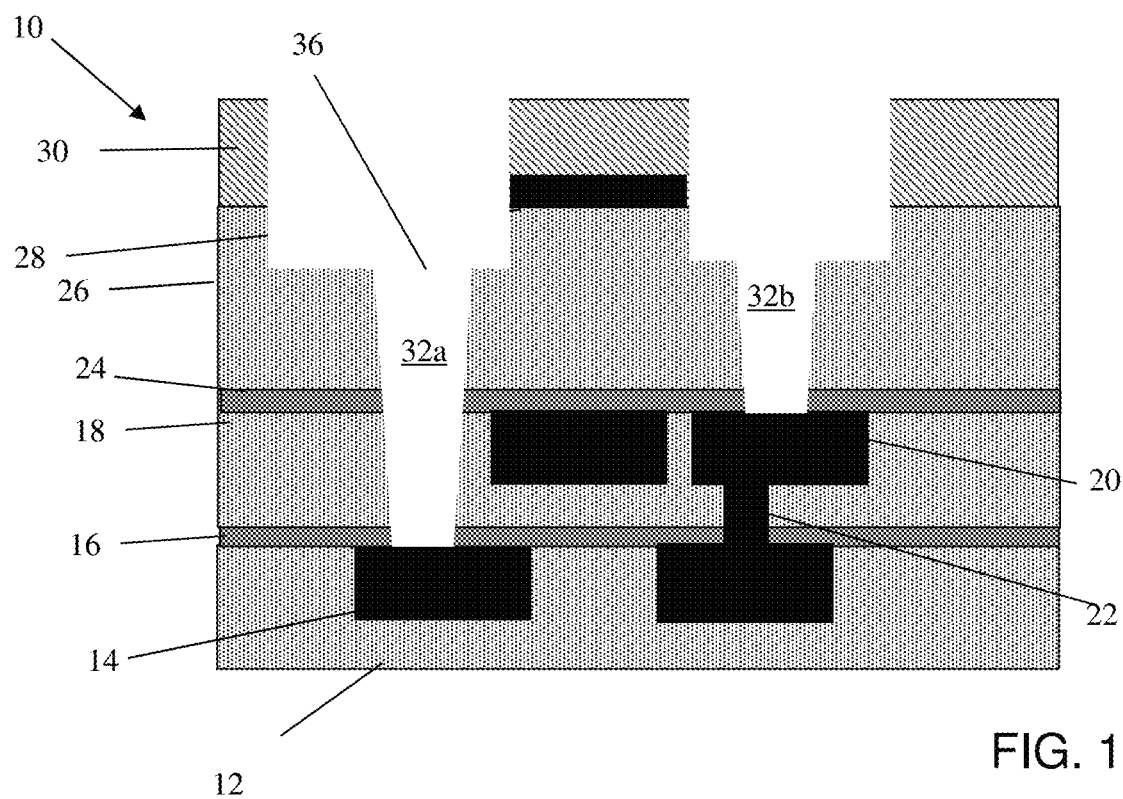
FIG. 1 shows a several wiring structure and a skip via structure, amongst other features, and respective fabrication processes in accordance with aspects of the present disclosure.

FIG. 1 shows a structure and respective fabrication processes in accordance with aspects of the present disclosure. In embodiments, the structure 10 shown in FIG. 1 can be BEOL or MOL structures, as examples. In particular, the structure 10 includes a plurality of wiring levels, e.g., M0, M1, etc., in a die. For example, the structure 10 includes wiring structures 14 provided in an insulator material 12. As should be understood by those of skill in the art, the wiring structures 14 are lower wiring structures, designated representatively at an M0 level for BEOL, or CA/CB leveler for middle of the line (MOL); although the wiring structures 14 can be provided at any lower level of the structure.

In embodiments, the insulator material 14 is an oxide based material ($SiO_2$), e.g., interlevel dielectric material, which can be deposited by a conventional deposition method, e.g., chemical vapor deposition (CVD). The insulator material 14 can also be an ultra low-k dielectric material, a carbon doped insulator material or other insulator material with porosity.

The wiring structures 14 can be formed by conventional lithography, etching and deposition methods known to those of skill in the art. For example, a resist formed over the insulator material 12 is exposed to energy (light) to form a pattern (opening). An etching process with a selective chemistry, e.g., reactive ion etching (RIE), will be used to form one or more trenches in the insulator material 12 through the openings of the resist. The resist can then be removed by a conventional oxygen ashing process or other known stripants. Following the resist removal, conductive material can be deposited in the one or more trenches by any conventional deposition processes, e.g., chemical vapor deposition (CVD) processes. The wiring structures 14 can be composed of any conductive material such as, e.g., copper, tungsten, cobalt, nickel, aluminum, ruthenium etc. The wiring structures 14 can also be lined with Ti, Ta, TiN, TaN, ruthenium, cobalt, etc. Any residual material 14 on the surface of the insulator material 12 can be removed by conventional chemical mechanical polishing (CMP) processes.

Following the CMP process, a capping layer 16 is formed on the wiring structures 14 and insulator material 12. In embodiments, the capping layer 16 can be a diffusion barrier layer, e.g., copper diffusion barrier layer, which prevents copper or other metallization diffusion to an upper insulator layer 18 as well as preventing oxygen diffusion to the wiring structures 14. Wiring structures 20 and via interconnect structures 22 are formed in the upper insulator layer 18. In embodiments, the wiring structures 20 and the interconnect structures 22 can be formed in any wiring layer above that of the wiring structures 14. Accordingly, the wiring structures 20 are upper wiring structures, designated at an M1, M2, etc. level; whereas, the interconnect structures 22 are upper via interconnect structures designated at V0, V1, etc. level. The wiring structures 20 and the interconnect structures 22 can be formed using conventional lithography, etching and deposition processes, similar to that which was discussed with respect to the formation of the lower wiring structures 14. The wiring structures 20 and the via interconnect structures 22 can be composed of any conductive material such as, e.g., copper, cobalt, nickel, tungsten, aluminum, ruthenium etc., lined with Ti, Ta, TiN, TaN, ruthenium, cobalt, etc.

Following a CMP process to remove any residual material from the surface of the insulator material 18, a capping layer 24 is formed on the wiring structures 20 and insulator material 18. In embodiments, the capping layer 24 can be a diffusion barrier layer, e.g., copper diffusion barrier layer, as described above, the insulator material 18 can be any insulator material as described above. A masking material 28 is formed on the surface of the insulator material 18, between edges of selected wiring structures 20 on the M1 level and wiring structures 14 on the M0 level. The masking material 28 can be TiN, deposited and patterned by conventional deposition and etching processes, e.g., RIE. A resist 30 is formed on the masking material 28 and insulator material 18, which is exposed to energy (light) to form a pattern (openings) in alignment with one or more wiring structures 14, 22 at the M0, M1 levels, respectively.

An etching process with a selective chemistry, e.g., RIE, will be used to form one or more via openings 32a, 32b in the insulator material 18 and capping layer 24, through the openings of the resist. The etching process can be timed to stop at a depth in which a surface of the upper wiring structure 20 is exposed by the via 32b. In this way, the via 32b will be at a depth which lands on and expose a surface of the wiring structure 20 on the M1 level, whereas, the via 32a will land on and expose a surface of the lower wiring (e.g., M0 level) layer 14 (passing through the upper wiring layer, e.g., M1 level). A trench RIE can also be performed to form a trench 36 (e.g., a trench for a wiring structure on an upper level, e.g., level M2), followed by removal of the resist 30 by conventional stripants and the masking material 28 by wet processes. In embodiments, the vias 32a, 32b and the trench 36 can be formed by single damascene or dual damascene processes. The combination of the skip via 32a and the trench 36 can be about 30 nm to about 150 nm in depth and about 12 nm to about 50 nm in width, e.g., high aspect ratio; although other aspect ratios are also contemplated herein.

Figure 2:
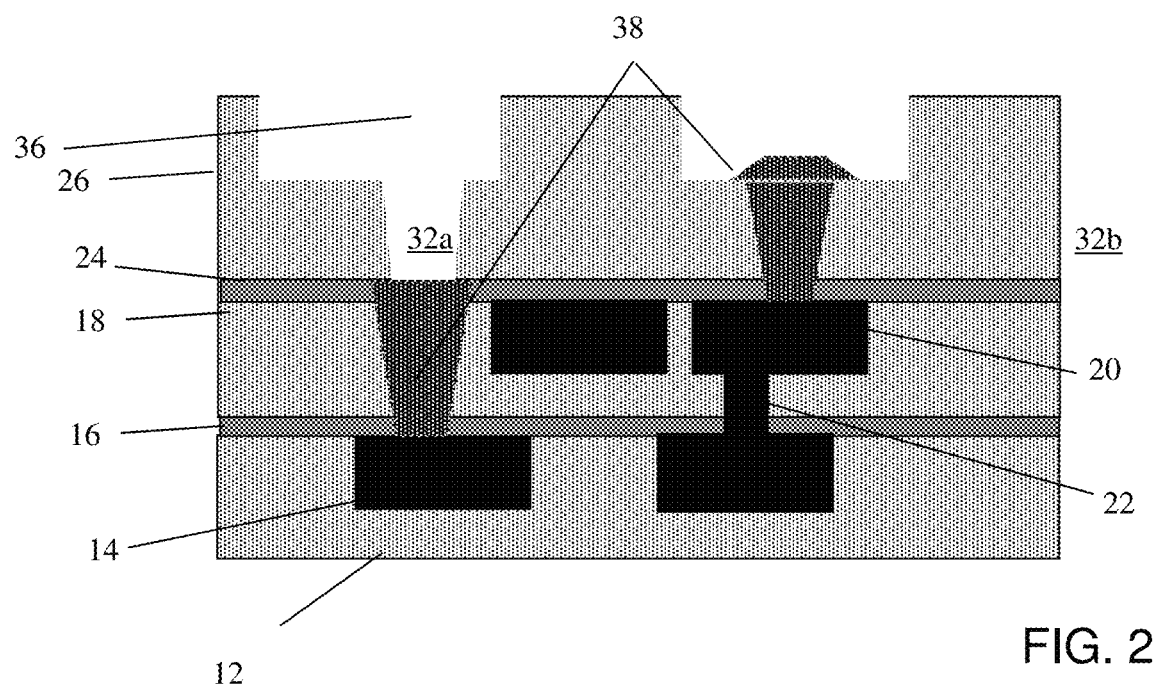
FIG. 2 shows a skip via structure filled with a cobalt material, amongst other features, and respective fabrication processes in accordance with aspects of the present disclosure.

As shown in FIG. 2, the skip via 32a is partially filled with cobalt (Co) 38; whereas, the interconnect via 32b can be completely filled with the cobalt (Co) 38 during the same processes. In embodiments, the via 32b can also be partially filled with cobalt (Co) 38 depending on the timing of the deposition process. Also, the trench 36 above the via 32b is partially filled with the cobalt (Co) 38; that is the cobalt (Co) 38 will not overfill the trench and, instead, only partially fill the trench 36 above the wiring structures 20 on the M1 level, as an example. It should be understood by those of skill in the art that the interconnect structure formed in the via 32a will be a skip via structure, electrically and directly connecting to wiring structure 14 on the M0 level, e.g., bypassing any connections in the M1 or above level. The cobalt (Co) 38 in the via 32a can be a regular dual damascene interconnect structure, providing electrical and direct connection to the wiring structure 14 on the lower level. The cobalt (Co) 38 in the via 32b, on the other hand, will be a regular single damascene trench interconnect structure, providing electrical and direct connection to the wiring structure 20 on the lower level. In embodiments, the cobalt can be substituted with nickel, as an example. In further embodiments, the grown material can be alloys of nickel or cobalt.

In embodiments, the cobalt (Co) 38 is formed by a selective electroless growth process on the M0, M1 level, from the bottom upwards in the vias 32a, 32b. More specifically, in embodiments, the cobalt (Co) 38 will selectively grow on the exposed metal surfaces of the one or more wiring structures 14 of a lower wiring layer and the wiring structures 20 on an upper wiring layer, while not growing on the insulator sidewalls of the vias 32a, 32b, e.g., the cobalt (Co) 38 will not grow on the insulator material forming the sidewalls of the vias. In this way, the cobalt (Co) 38 growth process will completely fill in the lower portion of the skip via 32a from the bottom, upwards, preventing any void formation within the via 32a. In other words, the selective growth process will ensure that there is a void free fill of the skip via 32a, regardless of its profile and aspect ratio, seed coverage, ultra-low k (ULK) plasma-induced-damage (PID) on either the wiring structures 14, 20 or cap-to-interlevel dielectric selectivity. This, in turn, void free formation of the interconnect structure will decrease the resistivity of the skip via 32a. It should also be understood by those of skill in the art that the electroless growth process of cobalt (Co) is compatible with dielectric materials, hence eliminating the need for a barrier layer.

Figure 3:
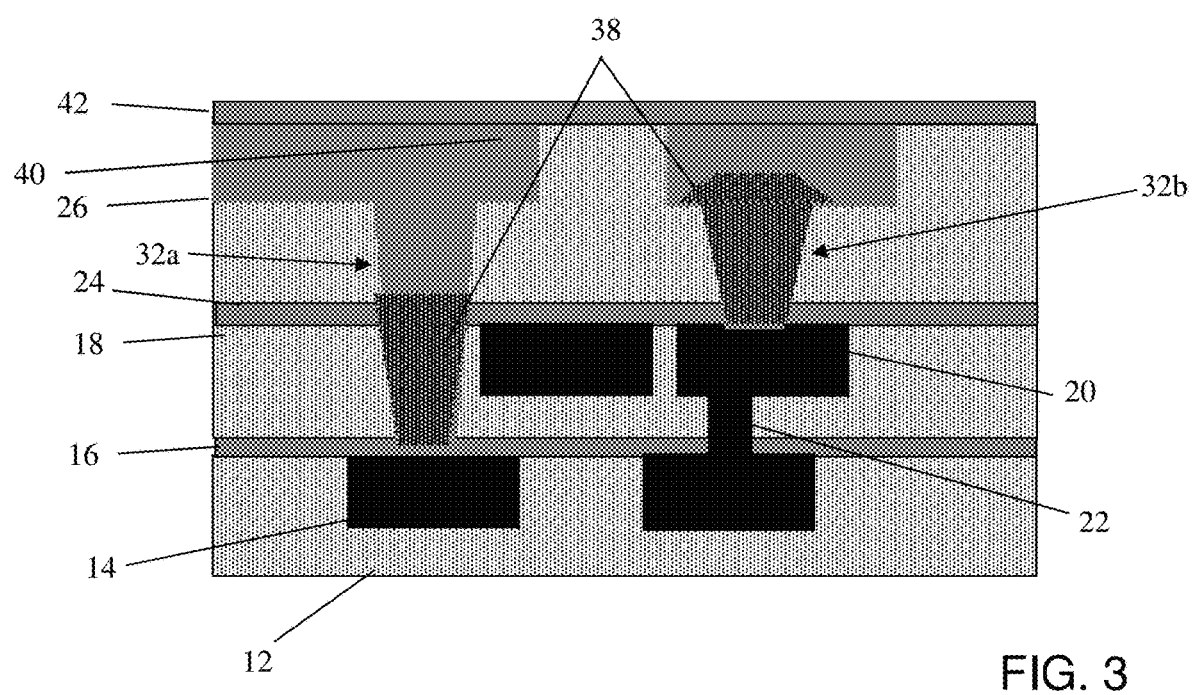
FIG. 3 shows metallization in the skip via structure and regular via structure, amongst other features, and respective fabrication processes in accordance with aspects of the present disclosure.

As shown in FIG. 3, the remaining portions of the via 32a and the trenches 36 (for upper wiring structures) are filled with conductive material 40 to form dual damascene structures, e.g., interconnect structures and upper wiring structures. In embodiments, the metal material can be copper, cobalt, nickel, aluminum, tungsten, it alloys, etc., to name a few contemplated materials. The conductive material 40 can be deposited by a conventional deposition method, e.g., electroless, electroplating, CVD and/or physical vapor deposition (PVD) and/or atomic layer deposition (ALD), followed by a conventional planarization process, e.g., CMP, to remove any residual material on the insulator layer 26. A capping layer 42 can then be formed over the insulator layer 26 and conductive material 40, followed by conventional BEOL processes for upper level builds until solder connect structures.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
   forming a via to expose one or more wiring structures of an upper wiring layer;
   forming a skip via which passes through the upper wiring layer and which exposes one or more wiring structures of a lower wiring layer;
   selectively growing metal material in the via and partially within the skip via; and
   filling remaining portions of the skip via with conductive material.

2. The method of claim 1, wherein the selective growth of the metal material comprises selectively growing cobalt or nickel in the skip via to partially fill the skip via.

3. The method of claim 2, wherein the selective growth of the cobalt or nickel is an electroless growth process.

4. The method of claim 3, wherein the electroless growth process is from a bottom upwards within the skip via, starting from an exposed portion of the one or more wiring structures of the lower wiring layer.

5. The method of claim 3, further comprising forming insulator on sidewalls on the skip via, wherein the electroless growth process does not grow on the insulator sidewalls of the skip via.

6. The method of claim 5, wherein the electroless growth process prevents void formation in the skip via.

7. The method of claim 3, wherein the conductive material is cobalt, nickel or its alloy.

8. The method of claim 3, wherein the growth of the cobalt or nickel or its alloys partially fills a wiring trench above the via and the method further comprising filling remaining portions of the wiring trench with the conductive material to form an upper wiring layer.

9. A method, comprising:
   forming a wiring layer with one or more wiring structures in a lower wiring layer;
   forming a wiring layer with one or more wiring structures in an upper wiring layer, located above the lower wiring layer;
   forming a via to expose the one or more wiring structures of the upper wiring layer;
   forming a skip via which passes through the upper wiring layer and which exposes the one or more wiring structures in the lower wiring layer;
   selectively growing metal material on exposed portions of the one or more wiring structures of the upper wiring layer and the lower wiring layer; and
   filling remaining portions of the skip via and a trench of another wiring layer above the upper wiring layer with conductive material.

10. The method of claim 9, wherein the selective growth of the metal material comprises an electroless selective growth process of cobalt or nickel in the skip via to partially fill the skip via.

11. The method of claim 9, wherein the electroless selective growth process is from a bottom upwards within the skip via, starting from an exposed portion of the one or more wiring structures of the lower wiring layer.

12. The method of claim 9, wherein the growth of the cobalt or nickel partially fills a wiring trench above the via and the method further comprising filling remaining portions of the wiring trench with the conductive material to form an upper wiring layer.

* * * * *